(12) United States Patent
Kaptanoglu

(10) Patent No.: US 7,944,238 B2
(45) Date of Patent: *May 17, 2011

(54) (N+1) INPUT FLIP-FLOP PACKING WITH LOGIC IN FPGA ARCHITECTURES

(75) Inventor: Sinan Kaptanoglu, Belmont, CA (US)

(73) Assignee: Actel Corporation, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/717,315

(22) Filed: Mar. 4, 2010

(65) Prior Publication Data

US 2010/0156460 A1 Jun. 24, 2010

Related U.S. Application Data

(63) Continuation of application No. 12/360,971, filed on Jan. 28, 2009, now Pat. No. 7,701,250.

(60) Provisional application No. 61/024,661, filed on Jan. 30, 2008.

(51) Int. Cl.
*G06F 7/38* (2006.01)
*H03K 19/177* (2006.01)

(52) U.S. Cl. ............ 326/40; 326/39; 326/41
(58) Field of Classification Search .......... None
See application file for complete search history.

(56) References Cited

U.S. PATENT DOCUMENTS

| 7,701,250 | B1* | 4/2010 | Kaptanoglu | 326/40 |
| 2005/0275428 | A1 | 12/2005 | Schlacter | |
| 2007/0075742 | A1 | 4/2007 | Feng et al. | |

* cited by examiner

*Primary Examiner* — Anh Q Tran
(74) *Attorney, Agent, or Firm* — Lewis and Roca LLP

(57) ABSTRACT

A logic module and flip-flop includes input multiplexers having data inputs coupled to routing resources. A clock multiplexer has inputs coupled to clock resources, and an output. An input-select multiplexer has a first input coupled to the output of an input multiplexer. A flip-flop has a clock input coupled to the output of the clock multiplexer, and a data output coupled to an input of the input-select multiplexer. A logic module has data inputs coupled to the output of the input select multiplexers. A flip-flop multiplexer is coupled to the data input of the flip-flop, and has inputs input coupled to the output of the first input multiplexer, the data output of the logic module, and a third input coupled to routing resources.

7 Claims, 3 Drawing Sheets (N+1) INPUT FLIP-FLOP PACKING WITH LOGIC IN FPGA ARCHITECTURES

CROSS-REFERENCE TO RELATED APPLICATIONS

This application is a Continuation of U.S. patent application Ser. No. 12/360,971, filed Jan. 28, 2009, which claims priority to U.S. Provisional Patent Application Ser. No. 61/054,661, filed Jan. 30, 2008, the entirety of both of which are hereby incorporated by reference herein.

BACKGROUND OF THE INVENTION

1. Field of the Invention

The present invention relates to user-programmable circuits. More particularly, the present invention relates to field programmable gate array (FPGA) integrated circuits and to arrangements for flip-flop and logic circuits in FPGA architectures.

2. The Prior Art

Modern FPGA functionality is provided by logic modules and flip-flops. Logic modules can be n-input look-up-tables (n-LUTs) or any other kind of function generators with n inputs, where (n>1). The flip-flops can be simple D type flip-flops, or they can have additional functionality such as CLEAR, RESET, LOAD, and ENABLE. These additional functions (with the exception of ENABLE) can be synchronous with the clock (CLK) or asynchronous (or both.)

Logic modules and flip-flops are often grouped into clusters that may typically vary in size from four to more than twenty. The clustering provides no additional functionality; it is done for routing convenience. In addition to the functionality provided by the logic modules and flip-flops, the FPGAs may include other types of functional blocks such as multipliers, RAMs, FIFOs, etc.

The most common arrangement of logic modules and flip-flops is shown in FIG. 1. In this kind of arrangement, the Y output of a logic module 10 directly drives the D input of the flip-flop 12. The A, B, C, and D data inputs of the logic module 12 are each driven by a multiplexer; multiplexer 14 drives data input A, multiplexer 16 drives data input B, multiplexer 18 drives data input C, multiplexer 20 drives data input D. Each of multiplexers 14, 16, 18, and 20 have a plurality of data inputs that are driven from routing tracks as is known in the art. Multiplexer 22 allows the Q output of flip-flop 12 to be used as an additional input to the D data input of logic module 10. The CLK input of flip-flop 12 is driven by the output of multiplexer 24, which allows selection between the various clock resources at its data inputs.

The arrangement shown in FIG. 1 has been used in earlier anti-fuse based FPGA products designed and marketed by Actel Corporation of Mountain View California. This is an economical in arrangement in terms of routing fabric usage, but it is also the most limited in terms of flexibly packing logic functions and flip-flops together. Unless the flip-flop is packed with the logic that drives it, the logic block functionality must be used as a feed through buffer and is thus wasted. In typical FPGA designs, this limitation causes a large number of isolated flip-flops to be present that are not packed together with logic modules.

The packing limitations of the arrangement shown in FIG. 1 can be improved significantly by allowing configurable connections between logic modules and the flip-flops, as shown in FIG. 2. An additional multiplexer 26 permits selection of the source of the D input to the flip-flop 12 between the Y output of the logic module 10 and the output of multiplexer 20 that drives the D input to the logic module 10.

The arrangement shown in FIG. 2 is very commonly used in various products by FPGA vendors. As will be appreciated by persons of ordinary skill in the art, the logic module 10 in the arrangement of FIG. 2 is no longer wasted if the D-input of the flip-flop 12 is not driven from within that module. On average, this improves the packing efficiency by packing 20% more flip-flops with logic modules. However, even this arrangement has limitations when the logic module 10 does not drive the flip-flop 12. The total number of combined data inputs to the logic module 10 and to the flip-flop 12 must be "n", the same as the maximum number of inputs to the logic module. This either means that the logic module is used in a limited role by computing a logic function of (n−1) inputs, or that one of the inputs of the logic module must be driven from the Q-output of the flip-flop.

Even though the arrangement shown in FIG. 2 improves the packing density, the improvement comes with a small performance penalty due to the delay through the flip-flop multiplexer 26 between the logic module 10 and the flip-flop 12. This is typically a small delay that is well worth the increase in packing density, as long as the multiplexer 26 remains a single-level multiplexer.

BRIEF DESCRIPTION

According to one aspect of the present invention, a logic module and flip-flop arrangement includes a first input multiplexer having a plurality of data inputs coupled to routing resources, and an output. Second through nth input multiplexers, each have a plurality of data inputs coupled to routing resources, and an output. A clock multiplexer has a plurality of inputs coupled to clock resources, and an output. An input-select multiplexer has a plurality of inputs and an output, a first input of the data select multiplexer is coupled to the output of the first input multiplexer. A flip-flop has a clock input coupled to the output of the clock multiplexer, a data output coupled to a second input of the input-select multiplexer, and a data input. A logic module has a plurality of data inputs and an output, one data input of the logic module coupled to the output of the input select multiplexer, the other data inputs of the logic module are each coupled to the output of a different one of the second through nth input multiplexers. A flip-flop multiplexer having an output coupled to the data input of the flip-flop, a first input coupled to the output of the first input multiplexer, a second input coupled to the data output of the logic module, and a third input coupled to routing resources.

According to another aspect of the present invention, the flip-flop multiplexer includes fourth and fifth inputs coupled to routing resources.

According to another aspect of the present invention, the logic module further includes a sum output, a carry-in input and a carry-out output, and the flip-flop multiplexer further includes a sixth input coupled to the sum output of the logic module.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

The present invention addresses the limitations of prior-art architectures by enlarging the routing multiplexer in between the logic module and the flip-flop, and accepting one or more inputs from routing resources.

Figure 3:
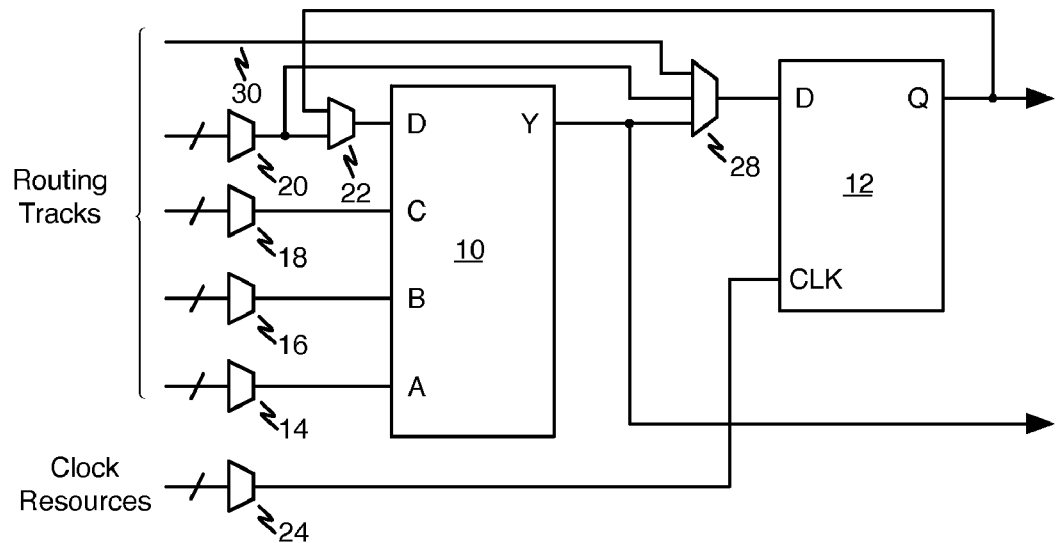
FIG. 3 is a block diagram of an arrangement of a logic module and a flip-flop in an FPGA architecture according to the present invention.

Referring now to FIG. 3, the A, B, C, and D data inputs of the logic module 12 are each driven by a multiplexer; multiplexer 14 drives data input A, multiplexer 16 drives data input B, multiplexer 18 drives data input C, multiplexer 20 drives data input D. Each of multiplexers 14, 16, 18, and 20 have a plurality of data inputs that are driven from routing tracks as is known in the art. Input-select multiplexer 22 allows the Q output of flip-flop 12 to be used as an additional input to the D data input of logic module 10. The CLK input of flip-flop 12 is driven by the output of multiplexer 24, which allows selection between the various clock resources at its data inputs. Flip-flop/routing multiplexer 28 permits selection of the source of the D input to the flip-flop 12 between the Y output of the logic module 10 and the output of multiplexer 20 that drives the D input to the logic module 10. The illustrative embodiment of FIG. 3 also provides a routing input directly to the flip-flop 12 on line 30, by-passing the logic module 10. Logic module 10 and flip flop 12 form a packed pair.

It has been verified that a single routing input to the flip-flop can increase the packing density by about 2.5%. The density can be increased even more by providing additional inputs to multiplexer 28 as shown in the illustrative embodiment of FIG. 4. Additional inputs 30, 32, and 34 are provided directly to the flip-flop through flip-flop/routing multiplexer 28, by-passing the logic module 10.

Figure 4:
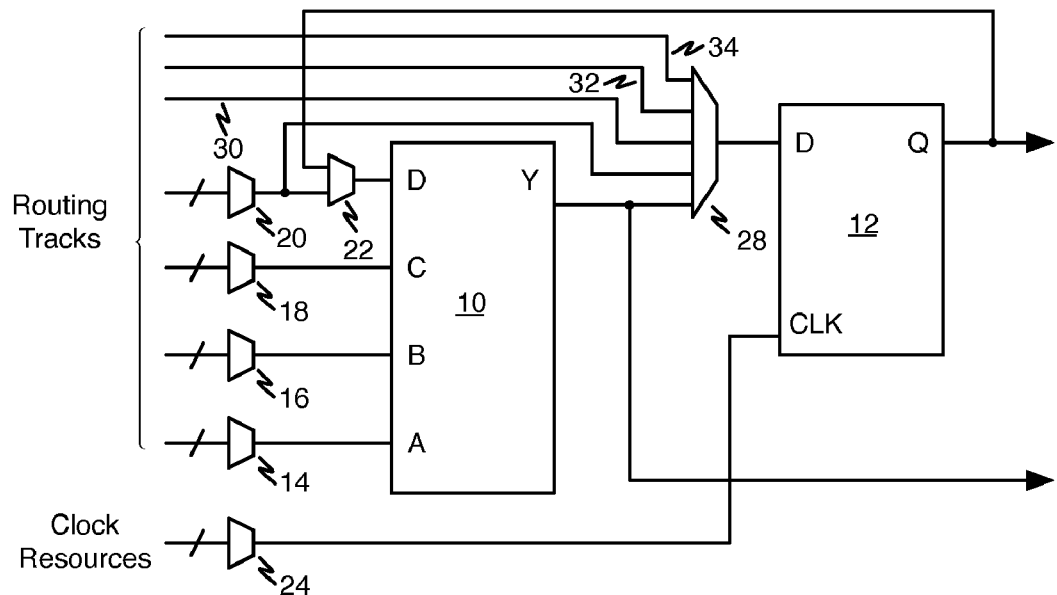
FIG. 4 is a block diagram of another arrangement of a logic module and a flip-flop in an FPGA architecture according to the present invention.

The present invention may be used in connection with both clustered and non-clustered routing architectures. When used in clustered architectures, for cluster sizes ranging from eight to sixteen, having three inputs from the routing resources directly to flip-flop 12 that bypass logic module 10 as shown in FIG. 4 results in a more than 5.5% density increase in clusters. For cluster sizes as large as 24, the benefit exceeds 7%. Similar improvements should be seen for non-clustered architectures.

It has been found that providing more than three inputs, however, results in diminishing returns in terms of packing density increase, except for large cluster sizes (with 18 or more logic modules and flip-flops) and special types of FPGA designs that are unusually register rich. Besides, the larger the multiplexer between the logic module and the flip-flop becomes, the slower the multiplexer gets (even if it stays as a single level multiplexer), and it is not desirable to grow it by allowing for more than three inputs for general purpose FPGAs. For FPGAs specifically targeted for high register applications, however, this can be done.

Figure 5:
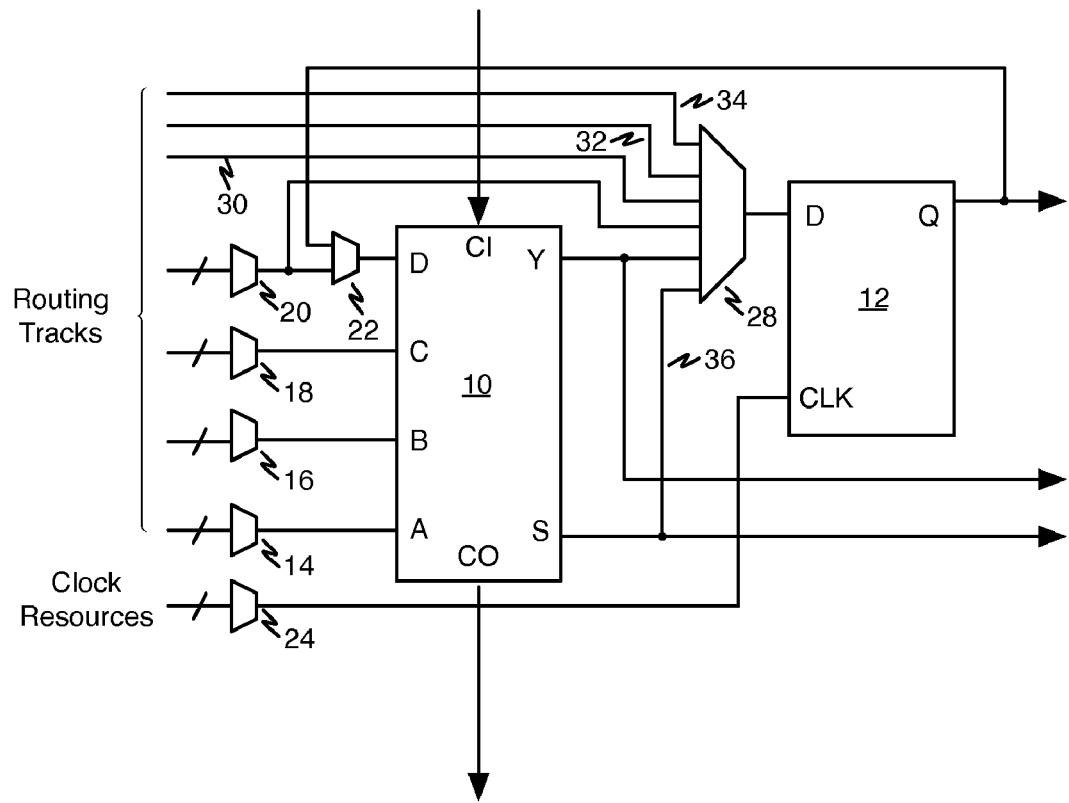
FIG. 5 is a block diagram of yet another arrangement of a logic module and a flip-flop in an FPGA architecture according to the present invention.

Referring now to FIG. 5, a block diagram illustrates that the present invention applies equally well for FPGAs where the logic module is combined with an arithmetic unit with a fast carry chain. In the illustrative embodiment of FIG. 5, the logic module 10 can be used to perform ordinary logic functions, or in an arithmetic mode, where it is provided with a second functionally distinct "S" output. The outputs Y and S can be recombined inside the logic module, or they can both be made available to the first level of routing resources. In the latter case, the multiplexer in between the logic module and the flip-flop will have to be enlarged by one more input as shown at reference numeral 36 in FIG. 5.

Figure 1:
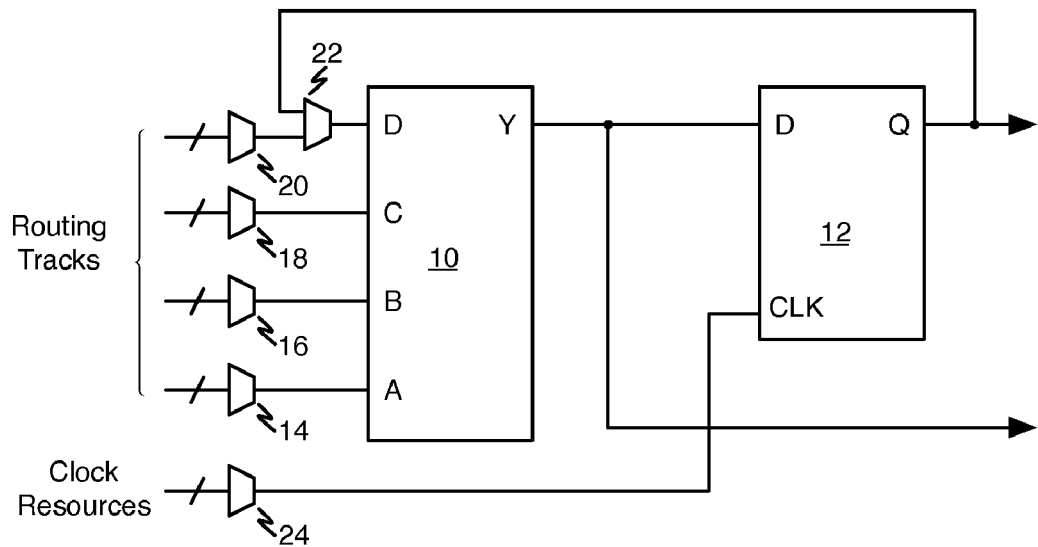
FIG. 1 is a block diagram of a typical arrangement of a logic module and a flip-flop in an FPGA architecture.
Figure 2:
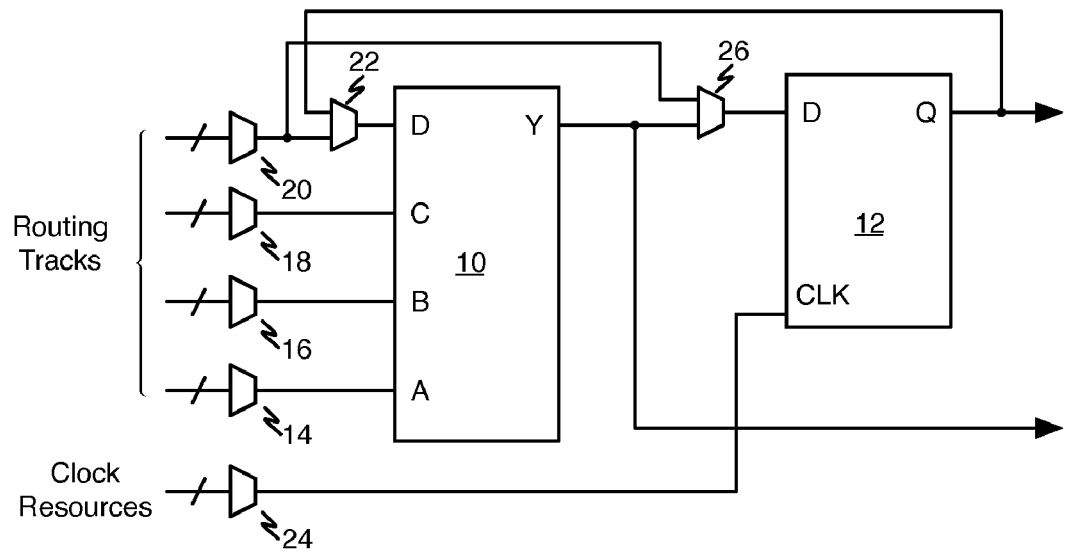
FIG. 2 is a block diagram of another typical arrangement of a logic module and a flip-flop in an FPGA architecture.

The present invention performs well with only a few additional inputs to the multiplexer 28 between the logic module 10 and the flip-flop 12. Flip-flop/routing multiplexer 28 is in general much smaller than any of the multiplexers 14, 16, 18, and 20 that furnish the inputs to the logic module 10. This is explained by the way in which flip-flops are commonly used in logic designs programmed into FPGAs. It has been discovered that the most common mode of flip-flop usage is to drive the flip-flop from a logic module without fanout, or to drive a logic module by the flip-flop without fanout. These two cases combined account for nearly 70% of all flip-flop usage in FPGA designs. In fact these two cases can be handled very efficiently by the prior-art arrangement of FIG. 1. The prior-art arrangement of FIG. 2 adds additional packing capability, where 90% of the flip-flops are packed with a logic module (again except for very register rich designs).

The present invention as illustratively shown in FIGS. 3, 4, and 5 increases the packing density to more than 95% with only three additional inputs to the flip-flop/routing multiplexer 28 in between the logic module 10 and the flip-flop 12. In exchange for this density increase of more than 5%, the area cost of the invention is about 0.3% of the core FPGA fabric area in a typical implementation, which makes it very attractive.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A logic module/arithmetic unit and flip-flop arrangement comprising:
   a first input multiplexer having a plurality of data inputs coupled to routing resources, and an output;
   second through nth input multiplexers, each having a plurality of data inputs coupled to routing resources, and an output;
   a clock multiplexer having a plurality of inputs coupled to clock resources, and an output;
   an input-select multiplexer having a plurality of inputs and an output, a first input of the input-select multiplexer coupled to the output of the first input multiplexer;
   a flip-flop having a clock input coupled to the output of the clock multiplexer, a data output coupled to a second input of the input-select multiplexer, and a data input;
   a logic module/arithmetic unit having a plurality of data inputs, a carry input, a carry output, a data output, and a sum output, one data input of the logic module coupled to the output of the input select multiplexer, the other data inputs of the logic module/arithmetic unit each coupled to the output of a different one of the second through nth input multiplexers; and
   a flip-flop/routing multiplexer having an output coupled to the data input of the flip-flop, a first input coupled to the output of the first input multiplexer, a second input coupled to the data output of the logic module/arithmetic unit, and at least one input coupled to routing resources.

2. The logic module/arithmetic unit and flip-flop arrangement of claim 1 wherein the second through nth input multiplexers comprise second through fourth input multiplexers.

3. The logic module/arithmetic unit and flip-flop arrangement of claim 1 wherein the at least one input of the flip-flop/routing multiplexer coupled to routing resources comprises a third input.

4. The logic module/arithmetic unit and flip-flop arrangement of claim 1 wherein the flip-flop/routing multiplexer further includes:
   a fourth input coupled to routing resources; and
   a fifth input coupled to routing resources.

5. The logic module/arithmetic unit and flip-flop arrangement of claim 4 wherein the flip-flop/routing multiplexer further includes a sixth input coupled to the sum output of the logic module/arithmetic unit.

6. The logic module/arithmetic unit and flip-flop arrangement of claim 1 wherein
   the data output of the logic module/arithmetic unit forms a first output; and
   the output of the flip flop forms a second output.

7. The logic module/arithmetic unit and flip-flop arrangement of claim 4 wherein:
   the carry input forms an input;
   the data output of the logic module/arithmetic unit forms a first output;
   the output of the flip flop forms a second output;
   the sum output of the logic module/arithmetic unit forms a third output; and
   the carry output of the logic module/arithmetic unit forms a fourth output.

* * * * *